United States Patent [19]

Saxena

[11] Patent Number: 5,642,296
[45] Date of Patent: Jun. 24, 1997

[54] METHOD OF DIAGNOSING MALFUNCTIONS IN SEMICONDUCTOR MANUFACTURING EQUIPMENT

[75] Inventor: Sharad Saxena, Richardson, Tex.

[73] Assignee: Texas Instruments Incorporated, Dallas, Tex.

[21] Appl. No.: 98,684

[22] Filed: Jul. 29, 1993

[51] Int. Cl.$^6$ .................................................. G06F 11/30
[52] U.S. Cl. ........................ 364/552; 364/149; 364/150; 364/578; 364/468.28; 438/14
[58] Field of Search ........................ 364/552, 550, 364/578, 580, 149–151, 551.01, 148, 468, 424.01, 424.03–0.06, 1, 431.01; 395/904, 911, 912, 22, 23; 382/56, 141, 144, 145, 149, 155, 156; 358/135; 371/45; 437/7, 8; 156/626.1, 627.1; 216/84–86; 118/663; 204/298.03, 32

[56] References Cited

U.S. PATENT DOCUMENTS

| | | | |
|---|---|---|---|
| 4,103,287 | 7/1978 | Frank | 382/56 |
| 4,295,218 | 10/1981 | Tanner | 371/45 |
| 4,736,316 | 4/1988 | Wallman | 364/149 |
| 4,755,925 | 7/1988 | Tsuchiya et al. | 364/151 |
| 4,870,695 | 9/1989 | Gonzales et al. | 358/135 |
| 4,975,827 | 12/1990 | Yonezawa | 364/151 |
| 5,130,936 | 7/1992 | Sheppard et al. | 364/580 |
| 5,155,677 | 10/1992 | Kurtzberg et al. | 364/468 |
| 5,216,749 | 6/1993 | Hamilton | 395/911 |
| 5,438,527 | 8/1995 | Feldbaumer et al. | 364/578 |

OTHER PUBLICATIONS

May and Spanos, *Automated Malfunction Diagnosis of Semiconductor Fabrication Equip. A Plasma Etch Application*, IEEE, Feb. 1993, vol. 6, No. 1 pp. 28–40.

*Primary Examiner*—Emanuel T. Voeltz
*Assistant Examiner*—Hal D. Wachsman
*Attorney, Agent, or Firm*—Robert L. Troike; Leo N. Heiting; Richard L. Donaldson

[57] ABSTRACT

Manufacturing modern day integrated circuits requires that each of a long sequence of steps perform to a tight set of specifications. Since equipment malfunctions are inevitable, profitable manufacturing of integrated circuits requires that such malfunctions be rapidly isolated and corrected. This invention describes the use of process models for diagnosing semiconductor manufacturing equipment malfunctions. One method makes use of multiple models and the second method makes use of a single model at multiple operating points. The fault isolation approaches described herein are based on the analysis of the discrepancy between model predictions and the observed outputs. The approaches have been evaluated on a process for plasma enhanced chemical-vapor deposition of silicon nitride, and the plasma enhanced etching of silicon nitride.

21 Claims, 3 Drawing Sheets

METHOD OF DIAGNOSING MALFUNCTIONS IN SEMICONDUCTOR MANUFACTURING EQUIPMENT

TECHNICAL FIELD OF THE INVENTION

This invention relates to semiconductor manufacturing and more particularly to a method of diagnosing malfunctions in semiconductor manufacturing equipment.

BACKGROUND OF THE INVENTION

Manufacturing present day integrated circuits is a long, complex, and expensive process. A state-of-the art integrated circuit requires between 200–300 processing steps, each of which must satisfy a tight set of specifications. Since equipment malfunctions are inevitable, it becomes essential for profitable manufacture of integrated circuits that the equipment malfunctions be quickly identified and repaired. This invention describes techniques for rapid identification of the causes of equipment malfunctions.

As an example of the problem addressed by this invention, FIG. 1 represents a plasma enhanced chemical vapor deposition process. The process outputs of interest are the film thickness of the deposited films, film refractive index, stress on the wafer due to the deposited film, and the film nonuniformity. The process inputs manipulated to get the desired values of the outputs are, say, three gases $g_1$, $g_2$, $g_3$; radio frequency (RF) power used to create the plasma; and the pressure in the vacuum chamber. Suppose that due to a miscalibration in one of the gas delivery systems the delivered gas flow is different from the requested flow. This could result in one or more process outputs being different from the desired values. Since the efficacy of the future processing steps depends on previous steps, and the functionality of the integrated circuit relies on each set performing to specifications, one would like to quickly identify the miscalibrated gas flow and correct it before it prevents a large number of integrated circuits from being correctly manufactured.

The diagnosis techniques described in this invention make use of equipment models for fault isolation. Equipment models describe relationships between process inputs and outputs. Equipment models can be obtained by two main techniques. The first is by modeling the underlying physics of the process, resulting in physically based models. The second technique ignores the underlying physics but models the process implemented by the equipment as a "black box" by fitting a predetermined functional form to process outputs (responses) at carefully selected inputs. Such models are called response surface models (RSM). See Box et al. book entitled *Empirical Model-Building and Response Surfaces*, published by John Wiley & Sons, New York, 1987. The diagnostic techniques described in this invention have been tested on RSM models, but could in principle be applied to physically based models also.

May and Spanos, in their article entitled *Automated Malfunction Diagnosis of Semiconductor Fabrication Equipment: A Plasma Etch Application* in "IEEE Transactions on Semiconductor Manufacturing", (6)1:28–40, 1993, report the use of RSMs for diagnosis. Their approach is based on the analysis of residuals that result from substituting the input parameter value that best explains a set of observations in the least square sense. In their approach, one needs to linearize the models around the current operating point. This limits the applicability of their approach for diagnosing large fault magnitudes using non-linear models. Furthermore, their approach also requires having models of multiple output of the process. B.T.B. Chu describes an approach using RSMs for diagnosis in *Fault Diagnosis With Continuous System Models*, in "IEEE Transactions on Systems, Man, and Cybernetics", (23)1:55–64, 1993. In Chu's approach for using RSMs for diagnosis, one discretizes the outputs and determines the probability of observing an output for different input combinations. On observing the output, one searches for the input that will maximize the probability of observing that value. The process of computing the probabilities can be computationally quite expensive. Furthermore, the outputs have to be discretized.

SUMMARY OF THE INVENTION

Equipment failures and shifts make an existing model inaccurate. A symptom of this problem is observed when the observed output is different from the value predicted by the model. Since the models capture the equipment behavior under normal operating conditions, one should be able to use them for determining the likely causes for the discrepancy between the model predictions and observations. The diagnosis approach used in the present invention utilizes the notion of analytic redundancy. Analytic redundancy is generally described by Patton et al. in a book entitled *Fault Diagnosis in Dynamic Systems: Theory and Application*, published by Prentice Hall International, UK, 1989. Analytic redundancy expresses the idea that a fault changes the state of a system and this changed state should manifest itself consistently in models of different aspects of the system, and in the system operation under different operating conditions. Furthermore, system state can be estimated by the analysis of the difference between the model predictions and observed behavior.

A concept of the present invention is that the changed system state should explain the difference between the observed outputs and model predictions consistently for all models and at all operating conditions. The diagnosis according to the present invention ranks the input parameters modeled according to their likelihood of being faulty. Broadly, the method is performed in two steps. The first is solving the RSMs for values of input parameters that would explain the observed outputs. The solving is done by fixing all the input parameters except the hypothesized fault to their fault-free values. For the case of a single model, solving is done for the value of a constant offset or gain at different operating points. The second step is ranking the fault hypothesis based on the consistency and the quality of the explanations obtained from the different models and/or at different operating points.

These and other features of the invention that will be apparent to those skilled in the art from the following detailed description of the invention, taken together with the accompanying drawings.

DETAILED DESCRIPTION OF THE INVENTION

Models enable the prediction of important output parameters under different input conditions. Traditionally, models have been used for process optimization and control. In addition to the above applications, the ability of models to predict the outputs from the knowledge of the inputs can also be used to diagnose the causes of shifts in the outputs from their desired settings.

In the traditional forward use of models, the inputs are fixed and the predictions for the outputs are obtained. However, in diagnosis one is interested in determining which of the input variables could be the cause for the observed outputs. If one assumes that only a single fault occurs at a time, then by repeatedly fixing all except one input parameter to their fault-free values, one can use the models in reverse to determine the values of the inputs that could be the cause for the outputs being different from their desired values. In this manner a fault in each of the inputs can be hypothesized. If one now can determine the likelihood of each fault, then the most likely faults can be ranked based on their likelihood.

This invention teaches two methods for ranking the fault hypotheses generated by using the models in reverse. The first method is based on the observation that if one has models for multiple input parameters, the true fault should solve out to have similar values in all the models. The second method is based on the observation that when one solves the same model at different operative points, the true fault should manifest itself similarly at all set points.

Figure 1:
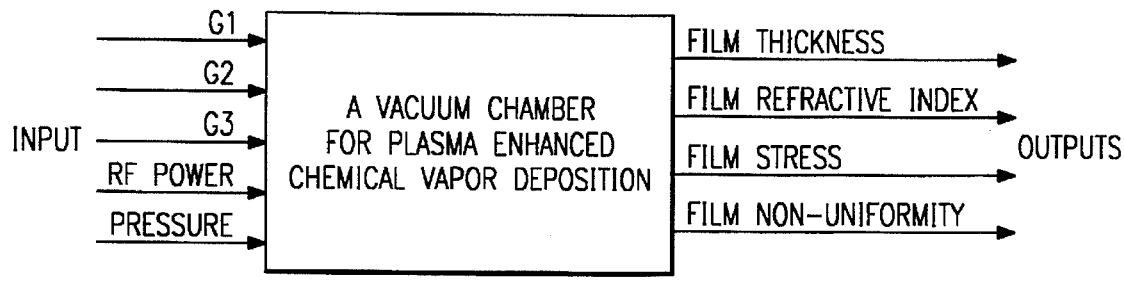
FIG. 1 illustrates the equipment diagnosis problem.
Figure 2:
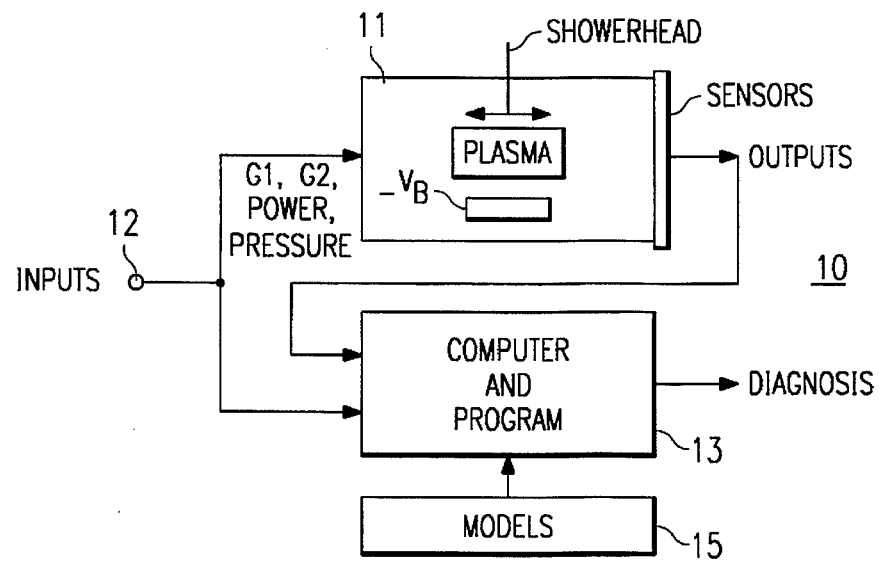
FIG. 2 is a system according to one embodiment of the present invention.

Referring to FIG. 2, there is illustrated the system 10 according to one embodiment, wherein the manufacturing equipment 11 receives inputs such as gases 1, 2 and 3, power and pressure (PR) from a user at input 12 to produce a plasma reaction, and the measured outputs can be stress, nonuniformity, refractive index and deposition rate. The outputs can be measured with either in-situ or ex-situ sensors. All things to measure the quality of the film of the semiconductor device being formed on the substrate in the chamber. A computer 13 receives the inputs and outputs and the equipment models from source 15. The equipment models used in the preferred embodiment are RSM models but physically based models can be used.

Figure 3:
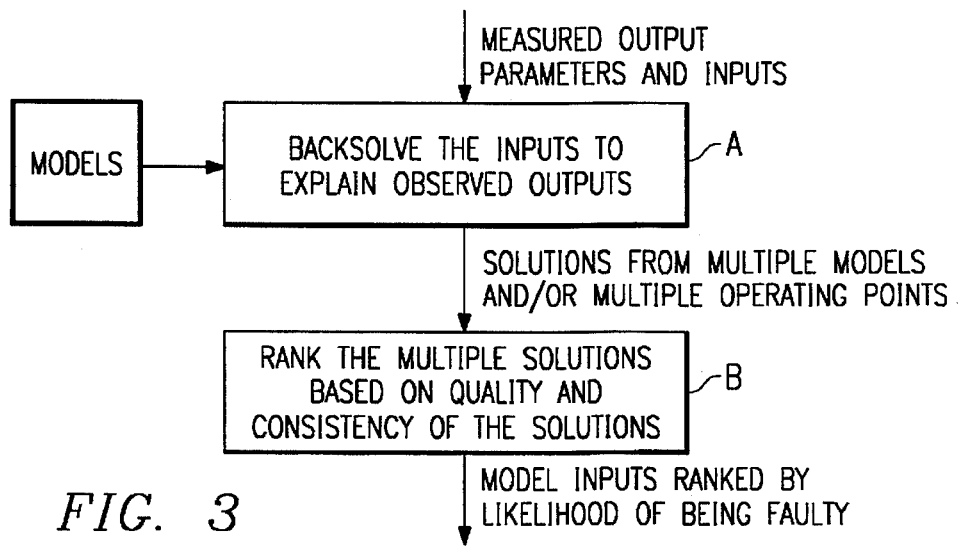
FIG. 3 is a function diagram of the method.

Referring to FIG. 3, according to one embodiment of the invention, the system and method shown in FIG. 2 ranks the input parameters according to their likelihood of being faulty by (Step a) first solving the RSM for values of input parameters that would explain the observed outputs. This is done by fixing all input parameters except the hypothesized fault to their fault-free values. The section A to follow entitled "Back-Propagating the Output," presents the method of using the RSMs in reverse to hypothesize the fault in each of the input variables. The second (Step b) follows, performing ranking of the solutions. The technique for ranking the faults based on their likelihood depends upon a numerical measure of the explanatory power of a hypothesized change in one of the variables and the consistency of this change for different models and observations. Section B presents this measure.

Figure 4:
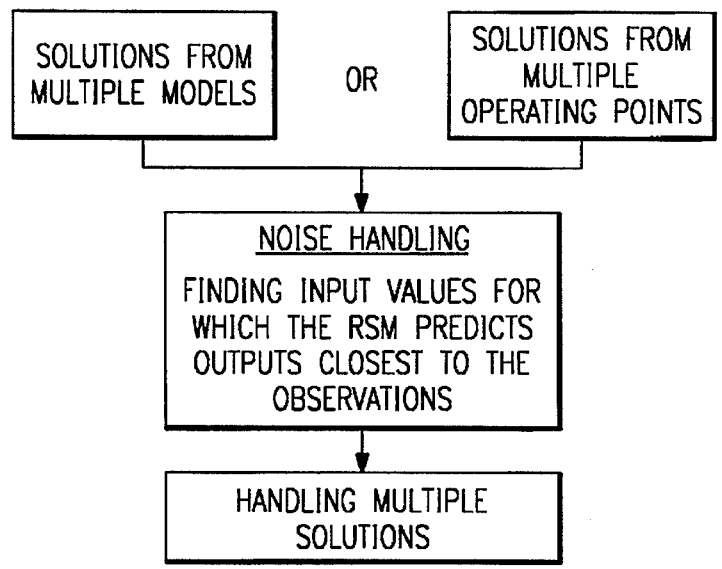
FIG. 4 is a function diagram of backsolving for the inputs.

A. Back-Solving the Output (FIG. 4)

A.1 Using Multiple Models (Method 1)

Consider the following example as an illustration of this approach. Suppose one has two RSMs:

$$y_1 = 2x_1 + 5x_2$$

$$y_2 = 7x_1 + 3x_2,$$

where $y_1$ and $y_2$ denote two output parameters, and $x_1$ and $x_2$ denote two inputs that can be manipulated to get the desired output values of $y_1$ and $y_2$. Say, one has set $x_1=3$ and $x_2=5$. However, due to miscalibration, the controller for $x_1$ delivers 5 units rather than 3. ad there been no fault, one would have observed $y_1=31$ and $y_2=36$. Due to the fault one observes $y_1=35$ and $y_2=50$. Assuming that one of $x_1$ and $x_2$ has caused the observed shift in the outputs, one would like to determine which of $x_1$ and $x_2$ is the cause of the shift.

Hypothesizing that $x_1$ is the culprit one gets:

$$35=2x_1+25 \rightarrow x_1=5$$

$$50=7x_1+15 \rightarrow x_1=5$$

Hypothesizing that $x_2$ is the culprit one gets:

$$35=6+5x_2 \rightarrow x_2=5.8$$

$$50=21+3x_2 \rightarrow x_2=9.67$$

The hypothesis consistent with both the RSMs is that $x_1=5$. Therefore, in this simple example, by utilizing the consistency of solutions we have diagnosed both the fault and its magnitude. Later in this section we will address the issue of modeling and measurement errors.

A.2 Using a Single Model at Multiple Setpoints (Method 2)

For some pieces of equipment, an accurate model for only one observable output parameter is available. In these situations, one can use a single RSM at multiple setpoints to isolate the faults. However, the price to be paid for lack of multiple models is that one has to have an a-priori expectation of possible fault mechanisms. Such expectation, based on the knowledge about the equipment, is captured in fault models.

Two fault models that we have considered are:

1. A constant offset in the input. If R is the domain of values that input x can take, and if x' denotes the faulty value of x, then the constant offset fault model says:

$$(\forall x \in R) x' = x + c.$$

In the above equation c is unknown but fixed constant, $\forall$ denotes "for all values of x", and $\in$ denotes "belonging to". In this fault, the delivered value is different than the requested value by a constant additive amount. Vacuum pressure and RF power usually exhibits this kind of fault.

2. A constant gain in the input. In this fault, the delivered value is different from the requested value by a constant multiplicative factor. That is, $$(\forall x \in R) x' = x + c.$$

Gas flows are examples of this type of fault due to miscalibrated MFCs.

More fault models can be incorporated in this technique as long as the true value can be expressed as some function of the inputs over the entire range of interest.

With these fault models, one can determine the hypothesis which consistently produces the same fault at all set points. As an illustration, suppose we pick one of the two RSMs used in the last section; namely $$y_1 = 2x_1 + 5x_2.$$

Say that $x_1$ has a constant gain fault such that $x'_1=0.5\,x_1$. Table 1 describes a situation involving two operating points that might occur with this fault.

If one hypothesizes that x, has a constant gain fault then, $$28=2x_1+25 \rightarrow x_1=1.5 \rightarrow x'_1=0.5x\text{ setpoint}$$

$$37 = 2x_1 + 35 \rightarrow x_1 = 1 \rightarrow x'_1 = 0.5 \times \text{setpoint}$$

If one hypothesizes that $x_2$ has a constant gain fault then, $$28 = 6 + 5x_2 \rightarrow x_2 = 4.4 \rightarrow x'_2 = 0.88x \text{ setpoint}$$

$$37 = 4 + 5x_2 \rightarrow x_2 = 6.67 \rightarrow x'_2 = 0.95x \text{ setpoint}$$

The only consistent constant-gain solution is that $x_1$ has been halved.

TABLE 1

| | Effect of a constant gain fault | | |
|---|---|---|---|
| $x_1$ setpoint | $x_1$ achieved | $x_2$ | $y_1$ observed |
| 3 | 1.5 | 5 | 28 |
| 2 | 1 | 7 | 37 |

A.3 Handling Noise in the Inputs and Outputs for Methods 1 and 2

In the above simplified examples few important aspects of RSMs were ignored. For instance, RSMs do not precisely predict the values of the output. There is always some difference in the value predicted by the RSM and the actual output. There are many sources for these errors. One source is the effect of parameters not included in the model. At the time of constructing the models, one selects a set of input variables most likely to have a significant effect on the outputs parameters of interest. A number of other input variables are ignored to simplify the models. These ignored variables cause small differences between the actual and the predicted outputs. Another reason for the difference between the actual and predicted values is that precise control of the inputs is rarely possible. Another reason for the difference is that the functional form selected for the RSMs may not be able to model the process behavior exactly.

Figure 5:
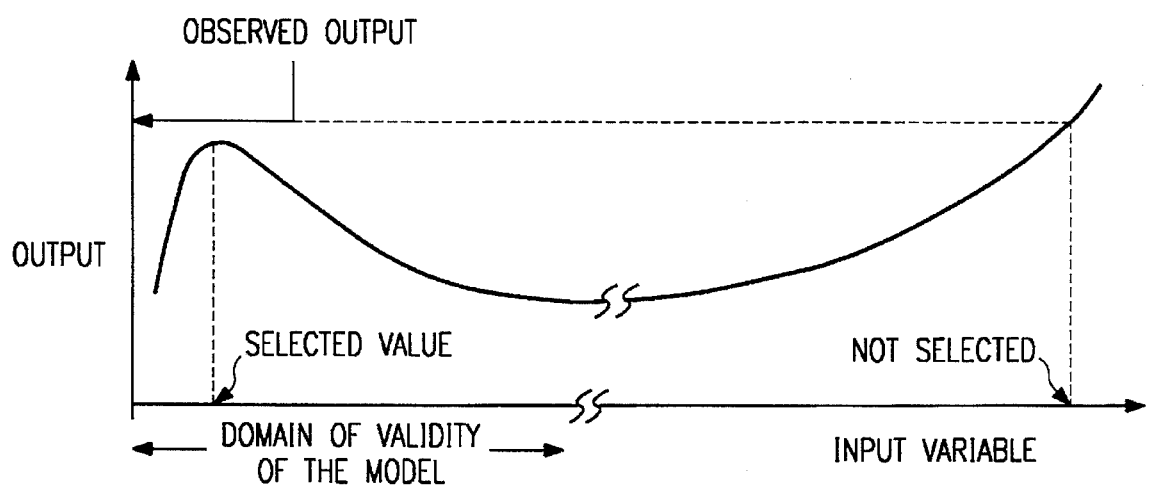
FIG. 5 illustrates handling differences in observed and predicted values.

One solution to the problem of differences between the model predictions and the actual output is that while back-propagating the inputs one seek the value of the input, in the range of validity of the models, for which the RSM predicts a value closest to the observed value; rather than seeking an exact solution for the observed output. The difference between the observed value and closest model prediction is called the residual. FIG. 5 illustrates this approach. The willingness to entertain errors in the outputs raises the problem of choosing the best hypothesis to explain a fault. In the previous examples, consistency of the solutions was the only criterion for choosing between hypotheses. However, if one is willing to ignore the quality of the explanation provided by a fault-hypothesis, one can always obtain perfect consistency by always insisting that the input is arbitrary but fixed constant, say 0, and ignoring the errors. Clearly, such a hypothesis cannot be intuitively considered as being the best explanation for the faults. The best hypothesis is the one that consistently provides high-quality explanations. Section B presents a numerical measure that combines the consistency and quality of explanation of a fault hypothesis.

A.4 Handling Multiple Solutions

Figure 6:
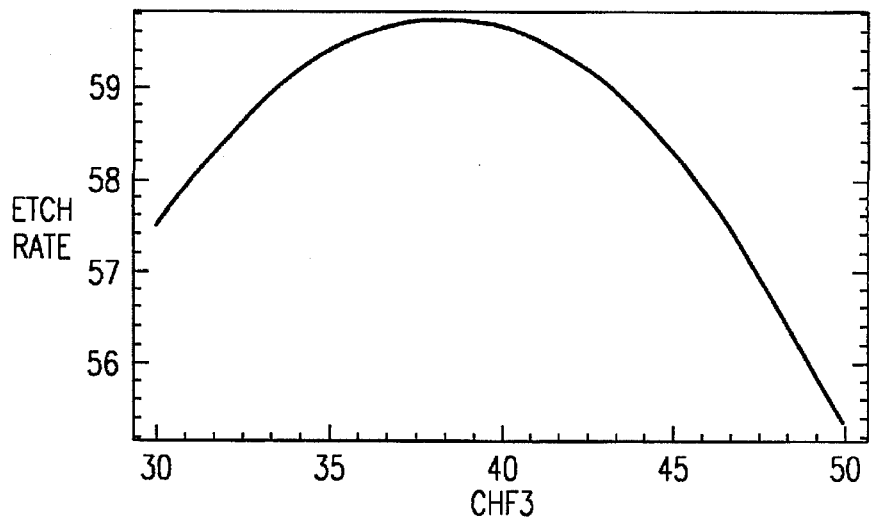
FIG. 6 illustrates multiple solutions for a given output.

Another aspect of RSMs that was ignored in the previous section is that RSMs are often polynomials of degree greater than one. For example, if the models are quadratic in one of the input variable, it is possible for a given output to obtain two solutions for the variable in the range of validity of the model. For example, FIG. 6 shows the relationship between the $CHF_3$ flow and the rate of etching silicon nitride on a TI-built Advanced Vacuum Process (AVP). In this figure the other process parameters have been kept at the values for the standard etch. As shown by this figure, there are a number of values of etch rate that will produce more than one solution for the $CHF_3$ flow.

This problem can be handled by keeping all the solutions (2 in the case of quadratic models) from different models or operative points, and choosing that set from all possible permutations of the different solutions that has the highest score on the quality-consistency metric. For example, suppose based on a quadratic model M1 we get solutions [(5, 11), (2, 10)]for an input variable, where each ordered pair is a solution with first term being the back-solved value of the input and second term being the percentage of the observed value by which the predicted value differs from the observed value. Further suppose that we get solutions [(5, 10), (9, 120)]from the model M2 for the same variable. Table 2 shows all permutations of these solutions. The measure for ranking hypotheses ranks the solution (5, 11) and (5, 10) to be the most likely planation for the fault.

TABLE 2

| All permutations from the example solution |
|---|
| (5,11) and (5,10) |
| (5,11) and (9,12) |
| (2,10) and (5,10) |
| (2,10) and (9,12) |

Figure 7:
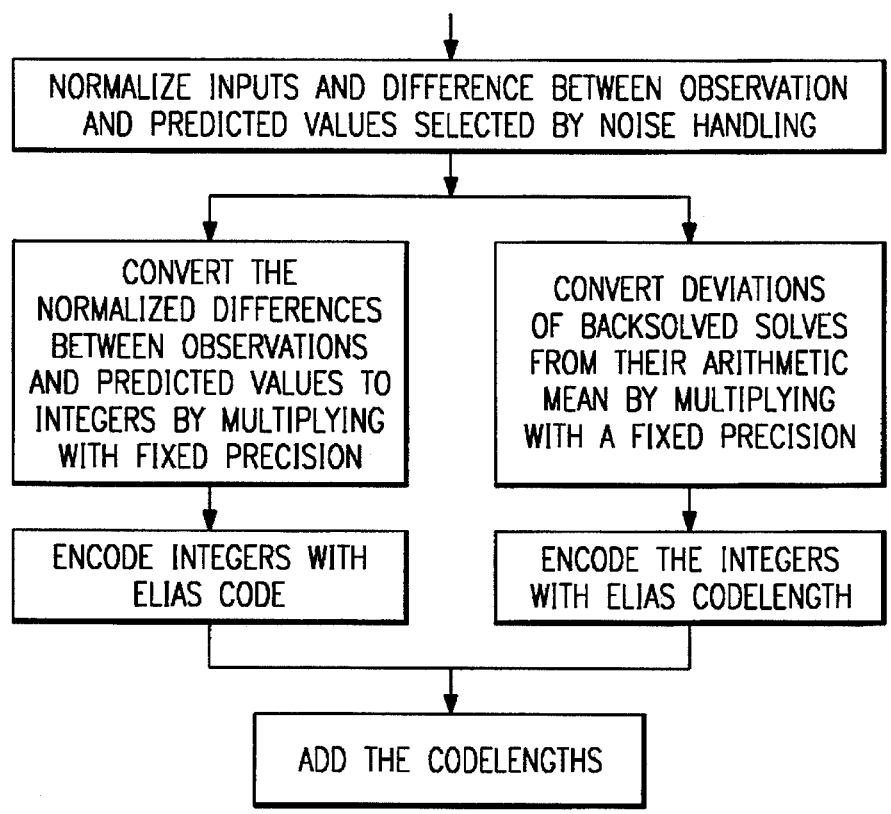
FIG. 7 is a function diagram of ranking.

B. A Measure of Explanatory Power and Consistency (FIG. 7)

The process of back-solving produces multiple mutually inconsistent fault-hypotheses. From these hypotheses one would like to select the one that is most likely to make accurate predictions in the future. Recent investigations in artificial intelligence, theoretical computer science, and mathematical statistics have shown that under fairly general conditions, for a given language, among all hypotheses that can be described in the language, the hypotheses that enables the observations to be described most compactly makes the most accurate predictions.

The language chosen for describing the observations must express the properties desired from any hypothesis for the observations. For diagnosis, one would like to select the hypothesis consistent with all the observations, and for which the difference between the observed and predicted values is the least. This section designs a language for describing these properties desired from a hypothesis. Hypothesis selection based on description length can be viewed as employing a Bayesian or subjective probability technique. The codelengths describe a likelihood function which assigns high likelihood to faults that have consistent back-solved values and small residuals.

A hypothesis is a good explanation for a set of observations if the difference between the observed data and the predictions made by the hypothesis is small. That is, the greater is the magnitude of the difference between the values predicted by the hypothesis and the actual observation, the more one would like to penalize the hypothesis. In our case, the amount by which a fault hypothesis is penalized should increase as the absolute value of the difference between the observation and the value predicted by the model using that hypothesis increases. In coding terms, one would like the codelengths to increase as the deviations increase.

This can be accomplished in a uniquely-decodable manner by first converting the absolute value of the deviations to integers by multiplying by a fixed precision, and encoding the resulting integers with Elias's code prefix code for positive integers (P. Elias, *Universal Codeword Sets and Representations of Integers*, "IEEE Transactions on Information Theory, Vol. IT-24, pages 194–203, 1971). For instance, if at most two decimal digits of precision are considered significant then the numbers are multiplied by 100. The prefix property ensures that codes for each member of a set can be concatenated without losing unique decodability. Table 3 gives the algorithm for determining the length of the Elias code for a positive integer.

TABLE 3

EliasCodelength for the positive integer j

```
length <-- 1
while ( ⌊log j⌋ ≠ 0) {
   length <-- length + ( 1 + ⌊log j⌋);
   j <-- ⌊log j⌋}
return(length)
```

Measuring consistency requires determining how much the different values differ from each other. We take the number of bits required to describe the difference between each value and the arithmetic mean of the values as a measure of consistency. This ensures that both consistency and explanatory power are measured in same units, namely bits. The deviation between a value and the arithmetic mean is encoded with Elias's code because we would like to penalize large deviations from the mean, since large deviations indicate lack of consistency. The arithmetic mean is coded with a fixed length code because we have no reason to a-priori consider one hypothesis to be more likely than others. However, if this is not the case then an appropriate variable-length code for arithmetic mean can be used.

Since all coding is done with prefix codes, the different codelengths can be added together to give the length of a uniquely decodable code for the observations. The combined codelength gives a single measure that combines consistency and explanatory power. To illustrate this coding scheme, suppose that we have two models and on back-solving the models with the fault hypothesis that v1 is faulty, we obtain the solution (50, 10) from one model and (56, 11) from the other. The number of bits required to encode the residuals is:

EliasCodelength(10)+EliasCodelength(11)=14 bits.

Similarly, a measure of consistency is obtained as:

EliasCodelength(|53−50|)+EliasCodelength(|53−56|)=8 bits.

The combined score for the hypothesis that v1 is faulty is 22 bits. Any hypothesis that obtains a lower score than 22 bits will be preferred by this measure.

One problem that arises as one implements the above technique is that the domain of validity of every input variables is not the same. For example, suppose that the domain of $x_2$ is between 300–500. Therefore, the maximum difference between two solutions for $x_1$ can only be 7 bits, while the maximum difference for $x_2$ can be about 14 bits. For a fair comparison, it becomes necessary to normalize the different input parameters to a common scale. To accomplish this, we normalize all the deviations from the arithmetic mean to be in the range 0–100. All deviations from the arithmetic mean are measured as a percentage of the allowable range of the input. For example, $x_1$ values of 10 and 20 are represented as:

$$\text{EliasCodelength}\left(\left|\frac{15-10}{10} \times 100\right|\right) +$$

$$\text{EliasCodelength}\left(\left|\frac{20-15}{10} \times 100\right|\right) = 24 \text{ bits}.$$

Similarly, the $x_2$ values of 300 and 500 are represented as:

$$\text{EliasCodelength}\left(\left|\frac{400-300}{200} \times 100\right|\right) +$$

$$\text{EliasCodelength}\left(\left|\frac{400-500}{200} \times 100\right|\right) = 24 \text{ bits}.$$

The constant offset faults are normalized by representing the magnitude of the offset to be a percent of the allowable domain of the corresponding variable. That is, if x' is the back-solved value for a variable X, and x is the valued specified in the example, and the magnitude of the domain of X is c, then the $$\frac{|x' - x|}{c} * 100.$$

A constant gain fault is described as x' *100/x.

Discussion and Experimental Results

The May and Spanos approach, mentioned in the Background of the Invention Section, is based on the analysis of residuals that result from substituting the input parameter value that best explains a set of observations in the least square sense. Our approach overcomes two limitations of their approach. Firstly, we do not need to linearize the models around the current operating point. This enables the diagnosis of large faults. Secondly, the notion of fault models enables us to diagnose processes for which only one RSM with a good fit may be available. In contrast to Chu's approach mentioned in the Background of the Invention section, in our approach there is no need to discretize the outputs, and the observed data directs the search for possible faults, making it computationally much more efficient.

In operating in the best mode, the steps described above are put into a computer program and loaded into a general purpose computer 13, as shown in FIG. 2 or in microcode. A state machine could also be developed. The computer and/or state machine would perform the steps based on the inputs provided to the equipment 11 under test, the outputs received from the equipment sensor and the models 13 provided.

We have applied this technique for fault-isolation in two processes. The technique requiring multiple models was applied to the process for plasma enhanced chemical vapor deposition of silicon nitride (PECVD nitride) on an Applied Material AMT 5000. The technique requiring a single model was applied to the process for selective etching of silicon nitride on a TI-built Advanced Vacuum Processor (AVP).

The models in the multiple model case were a set of quadratic RSMs for the deposition of a film of silicon nitride as a protective overcoat on integrated circuits. These equations predict the rate at which the film is deposited, the refractive index of the deposited film, the stress on the silicon wafer due to the film, and the non-uniformity in film thickness across the wafer (P.K. Mozumder, S. Saxena and D. J. Collins, *A Monitor Wafer Based Controller for PECVD Silicon Nitride Process on AMT5000*, to appear in the October 1993, "Proceedings of the Advanced Semiconductor Manufacturing Conference and Workshop, 1993"). The models take as input flow rates of three gases; nitrogen, silane and ammonia; the amount of radio-frequency (RF) power used for the reaction; the pressure in the reactor; and the spacing or gap between the RF electrodes. To test the diagnosis algorithm, single faults were deliberately introduced in the reactor. Table 2 summarizes the results obtained by the diagnosis algorithm.

The simulations were performed by changing the gains of the different inputs and adding noise distributed according to $N(0,\sigma^2)$ to the output, where $\sigma$ is the standard error of the RSM model, and $N(\mu,\sigma^2)$ denotes a normal distribution with mean $\mu$ and variance $\sigma^2$. Supervisory process control was also simulated. For each fault, a number of wafers were run until at least 2 operative points were obtained for which the

TABLE 2

| Diagnosis Results From Multiple Models | | | | | | |
|---|---|---|---|---|---|---|
| | Codelengths (Bits) | | | | | |
| Fault | $NH_3$ | Gap | $N_2$ | Pressure | $SiH_4$ | RF | Comments |
| RF | 59 | 73 | 68 | 64 | 64 | <u>27</u> | Correct Diagnosis. Large difference between the two smallest codelengths. |
| $SiH_4$ | 70 | 64 | 70 | 62 | <u>39</u> | 52 | Correct Diagnosis. Large difference between the two smallest codelengths. |
| $NH_3$ | <u>34</u> | 62 | 44 | 39 | 36 | 30 | Fault among the top two. Small differences between the five smallest codelengths. |

The RF and silane fault were correctly diagnosed by the algorithm. The ammonia fault was second in the ranking of faults by their likelihood. However, in the ammonia-fault case the difference between the codelengths of the first four hypotheses is small. The reason for this could be that for three of the four outputs, the effect of the ammonia fault on the output is less than the standard errors of the models. Since the accuracy of the explanation values depends on the accuracy of the models, observed values that are within the prediction error of the models are not correctly resolved by the explanation procedure. In the RF and silane faults, at least three of the four observed values were outside the expected prediction errors.

For diagnosis using a single model, the model is an RSM for the etch-rate of silicon nitride on a TI-built Advanced Vacuum Processor. This process was under supervisory process control, which provides the multiple operative points needed for this approach. Two types of evaluation of the fault-isolation technique was performed. Firstly, as before, single faults were deliberately introduced in the reactor. The etch-rate obtained at two different operating points produced by the controller was used for diagnosis. Based on the diagnosis results from these equipment experiments and computer simulations, the diagnosis algorithm was made a part of the routine operation of the equipment. Table 3 summarizes the results obtained in the fault experiments. The algorithm correctly diagnosed both the faults introduced during these experiments.

TABLE 3

| Diagnosis Results From a Single Model | | | | | |
|---|---|---|---|---|---|
| | Codelengths (Bits) | | | | |
| Fault | $CHF_3$ | $CF_4$ | $O_2$ | Pressure | RF | Comments |
| $O_2$ | 26 | 26 | <u>13</u> | 20 | 26 | Correct Diagnosis |
| RF | 28 | 24 | 14 | 26 | <u>8</u> | Correct Diagnosis | etch-rate was different from the model prediction by at least 1 $\sigma$. If the diagnosis algorithm could not isolate the fault to a set of one or two most likely candidates, additional wafers were run and set points that produce etch-rate outside 1 $\sigma$ limits were collected. Table 4 summarizes the simulation results. In the table, a checkmark (✓) denotes that the fault was correctly diagnosed. No detection stands for the situations where either all hypotheses had codelengths greater than the detection threshold, or more than two hypotheses had codelengths less than the threshold. This table shows that when the fault is one of the modeled effects, the algorithm is effective in isolating the fault to be among one or two most like faults. However, when the fault is not one of the modeled effects, either all faults have a high codelength, indicating that no fault consistently explains all the observations, or RF is diagnosed to be faulty. The reason for the false alarms involving RF is that process is most sensitive to RF power, and consequently small changes in RF power can explain the observed outputs. This limitation of using single models can be overcome by using multiple models at multiple set points. Each model would then be an independent evidence source. The diagnoses produced by the different models can then be combined, say by a simple voting scheme.

TABLE 4

Simulations results for diagnosis with a single model

| Effect | Change/Diagnosis | | | |
|---|---|---|---|---|
| CF4 | setpoint *1.5<br>2 Setpoints:<br>✓ | setpoint *1.25<br>2 setpts: no detection<br>3, 4 setpts: CF4, RF | setpoint *0.75<br>No Xbar SQC alarm | setpoint *0.6<br>No Xbar SQC alarm |
| CHF3 | No Xbar SQC alarm | Not attempted because no alarms in larger errors | 2, 3 setpts: no detection<br>4 setpts: CHF3, RF | 2, 3, 4 setpts: no detection<br>5 setpts: CHF3, RF |
| O2 | 2 setpoints:<br>✓ | 2 setpts: O2 and CF4<br>3 setpts: ✓ | 2 setpts: O2, CHF3<br>3 setpts: ✓ | 2, 3 setpts: FALSE alarm (CHF3 values close)<br>Repeat 1:<br>3 setpts:<br>Repeat 2: ✓<br>3 setpts: No detection |
| Press | 2 setpts: Pr, CF4<br>3 setpts: ✓ | 2 setpts: Pr, RF<br>3 setpts: ✓ | 3 setpts: no detection<br>Little effect on the output. Difficult to get points outside 1 sigma | 2 setpts: no detection<br>3 setpts: (Pr, but constant offset!)<br>4 setpoints:<br>Repeat 1 ✓<br>2, 3, 4 setpts:<br>Repeat 2 ✓<br>3 setpts: No detection |
| RF | Takes model too much outside range. Not attempted | 2 setpoints: ✓ | 2 setpts: RF, Pr<br>3 setpts: ✓ | 2 setpoints: ✓ |

The diagnosis algorithm was in routine use on the process for etching silicon nitride on a TI-built Advanced Vacuum Processor (AVP). A threshold was set on the codelength for considering a fault hypothesis confident based on the experience with the algorithm during simulations. Furthermore, if for five distinct observations used for diagnosis no confident hypothesis was observed, the fault was attributed to an modeled effect, and the algorithm was reset. Resetting the algorithm involved flushing all the stored settings and using the current model as tuned by the controller. The tuned model was used because it represents the controller's best estimate of the current equipment state.

During the extended operation, the diagnosis algorithm reported the following two confident fault hypotheses.

1) The first fault hypothesis (RF fault) was that the delivered RF power is less than the power requested by the operator. Verification by the process engineer confirmed that the RF power was indeed miscalibrated such that the delivered power was approximately 200 W less than the requested value.

2) The second fault hypothesis (oxygen fault) was that the delivered oxygen flow was higher than requested. Verification revealed that for three process gases, including oxygen, the delivered flow was lower than requested. In this case, the fault was correctly identified by the algorithm, but the direction of the fault was incorrect. We suspect that this may be because the diagnosis algorithm makes a single fault assumption, and in this case there was a triple fault.

This invention described the use of process models for diagnosing equipment malfunctions during semiconductor manufacturing. Two techniques were described. The first technique makes use of models of multiple operating points. The second technique makes use of a single model at multiple operating points. Both of the techniques are based on the analysis of the discrepancy between model predictions and the observed outputs. The results obtained by fault experiments, computer simulations and extended operation show that the techniques described in this invention effectively diagnose faults in semiconductor manufacturing equipment.

Applicant believes that analytic redundancy is a powerful and a general notion that can be adapted in many different directions for applications to diagnosis. One can view the model-based diagnosis techniques presented here as one technique for estimating the state of a system. This observation opens the possibility of applying other estimation techniques to diagnose semiconductor manufacturing equipment.

Other Embodiments

Although the present invention and its advantages have been described in detail, it should be understood that various changes, substitutions and alterations can be made herein without departing from the spirit and scope of the invention as defined by the appended claims.

What is claimed is:

1. A computer implemented method of diagnosing malfunctions in manufacturing equipment comprising the steps of:

a) sensing said manufacturing equipment outputs with a sensor to provide sensed output values;

b) providing equipment models that describe predicted relationship between possible manufacturing equipment inputs and predicted output values;

c) backsolving actual manufacturing equipment inputs without linearizing said equipment models to explain said sensed output values sensed by said sensor to provide signals representing multiple fault hypotheses; and d) ranking the signals representing multiple fault hypotheses based on their quality and consistency with respect to said sensed equipment output values.

2. The method of claim 1 wherein said backsolving step includes backsolving fault hypotheses from multiple models.

3. The method of claim 1 wherein said backsolving step includes backsolving for fault hypotheses from multiple operating points.

4. The method of claim 1 wherein said equipment models are response surface models.

5. The method of claim 4 wherein said backsolving step includes backsolving fault hypotheses from multiple response surface models.

6. The method of claim 4 wherein said backsolving step includes backsolving fault hypotheses from multiple operating points.

7. The method of claim 1 wherein Step c includes the step of finding the equipment inputs, in the complete range of validity of the equipment models, for which a response surface model value predicts a value closest to a sensed value.

8. The method of claim 1 wherein Step c further includes the steps of keeping all fault hypotheses and choosing a fault hypothesis from all possible permutations of the different fault hypotheses that has the highest score on a quality-consistency metric.

9. The method of claim 1 wherein Step d includes the step of selecting a fault hypotheses for which the difference between the sensed output value and the predicted output value is the least.

10. The method of claim 1 wherein said Step d includes the step of first converting an absolute value of residuals to integers by multiplying by a fixed precision and encoding the resulting integers with Elias's code prefix for positive integers.

11. The method of claim 1 wherein the Step d includes step of measuring consistency by determining magnitude of differences in back-solved values of a fault hypothesis from different models at different operating points.

12. The method of claim 11 wherein said step of measuring consistency comprises the step of adding together different Elias codelengths of deviations from an arithmetic mean of said magnitude of differences.

13. The method of claim 12 including the step of normalizing all inputs to a common scale.

14. The method of claim 1 including the step of normalizing all the inputs to a common scale.

15. The method of claim 14 wherein the normalizing step includes the step of normalizing all deviations from arithmetic mean of said inputs to be in the range of 0–100 and all deviations from the arithmetic mean being measured as a percentage of the allowable range of the input.

16. A diagnostic machine for manufacturing equipment comprising:

a sensor for sensing output values from said manufacturing equipment;

a source of equipment models that describe predicted relationships between possible manufacturing equipment inputs and predicted output values of said manufacturing equipment;

means coupled to said source and said sensor and responsive to said equipment models and said sensor output values sensed by said sensor for backsolving actual equipment inputs without linearizing to explain output values from said equipment to derive fault hypotheses; and means coupled to said backsolving means for ranking said fault hypotheses based on their quality and consistency with respect to sensed output from said sensor.

17. The diagnostic machine of claim 16 wherein said means for backsolving includes means under program control for backsolving for fault hypotheses from multiple models.

18. The diagnostic machine of claim 16 wherein said means for backsolving includes means for backsolving for fault hypotheses from multiple operating points.

19. The diagnostic machine of claim 16 wherein said equipment models are response surface models.

20. The diagnostic machine of claim 16 wherein said means for ranking includes the means under program control for converting an absolute value of residuals to integers by multiplying by a fixed precision and encoding the resulting integers with Elias' code prefix for positive integers.

21. A computer implemented method of diagnosing malfunctions in equipment for plasma enhanced processes in a vacuum chamber as used in semiconductor manufacturing comprising the steps of:

a) sensing effects of the process on the semiconductor wafers in said vacuum chamber to provide sensed signals;

b) providing equipment models that describe predicted relationship between input gases, radio frequency power used to create the plasma and the pressure in said vacuum chamber and predicted effects on the semiconductor wafer;

c) backsolving actual vacuum chamber inputs in a processor under program control in the complete range of validity of the equipment models for which a response surface model value predicts values closest to values associated with said sensed signals without linearizing said response surface models to provide signals representing multiple fault hypotheses; and d) selecting a signal representing a fault hypothesis for which the differences between values associated with said sensed and predicted values is the least.

* * * * *